(12) United States Patent
Sonokawa et al.

(10) Patent No.: US 7,201,801 B2
(45) Date of Patent: Apr. 10, 2007

(54) HEATER FOR MANUFACTURING A CRYSTAL

(75) Inventors: Susumu Sonokawa, Fukushima (JP); Ryoji Hoshi, Fukushima (JP); Wataru Sato, Fukushima (JP); Tomohiko Ohta, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 89 days.

(21) Appl. No.: 10/503,721

(22) PCT Filed: Sep. 8, 2003

(86) PCT No.: PCT/JP03/11444

§ 371 (c)(1),
(2), (4) Date: Aug. 6, 2004

(87) PCT Pub. No.: WO2004/024998

PCT Pub. Date: Mar. 25, 2004

(65) Prior Publication Data

US 2005/0081779 A1 Apr. 21, 2005

(30) Foreign Application Priority Data

Sep. 13, 2002 (JP) .............................. 2002-267600

(51) Int. Cl.
*C30B 35/00* (2006.01)

(52) U.S. Cl. ........................ 117/217; 117/218; 117/222; 117/900

(58) Field of Classification Search ................ 117/217, 117/218, 222, 900; 219/424, 426
See application file for complete search history.

(56) References Cited

U.S. PATENT DOCUMENTS

| | | | | | |
|---|---|---|---|---|---|
| 5,766,347 | A | * | 6/1998 | Shimomura et al. | 117/217 |
| 5,968,266 | A | * | 10/1999 | Iino et al. | 117/217 |
| 6,093,913 | A | * | 7/2000 | Schrenker et al. | 219/424 |
| 6,285,011 | B1 | * | 9/2001 | Cherko | 219/426 |

FOREIGN PATENT DOCUMENTS

| | | |
|---|---|---|
| JP | A 2-172885 | 7/1990 |
| JP | B2 7-72116 | 8/1995 |
| JP | A 9-208371 | 8/1997 |
| JP | A 9-235178 | 9/1997 |
| JP | A 10-167876 | 6/1998 |
| JP | A 11-139895 | 5/1999 |
| JP | A 11-199371 | 7/1999 |
| JP | A 2001-39792 | 2/2001 |

* cited by examiner

*Primary Examiner*—Felisa Hiteshew
(74) *Attorney, Agent, or Firm*—Oliff & Berridge, PLC

(57) ABSTRACT

The present invention provides a heater for manufacturing a crystal by the Czochralski method comprising at least terminal portions supplied with current and a heat generating portion by resistance heating, and being arranged so as to surround a crucible containing a raw material melt, wherein the heater has a uniform heat generation distribution to the raw material melt after deformation while in use during crystal manufacture. It is thus possible to prevent hindrance of monocrystallization and unstable crystal quality caused by ununiform temperature in the raw material melt due to deformation of the shape of the heater's heat generating portion while in use during crystal manufacture.

25 Claims, 2 Drawing Sheets

(a)

(b)

HEATER FOR MANUFACTURING A CRYSTAL

TECHNICAL FIELD

The present invention relates to a heater for manufacturing a crystal used during crystal growth by the Czochralski method, a crystal manufacturing apparatus and a crystal manufacturing method using the heater and more particularly to a heater for manufacturing a crystal suited to manufacturing large diameter crystals of eight inches or more in diameter while applying a magnetic field, a crystal manufacturing apparatus and a crystal manufacturing method using the heater.

BACKGROUND ART

Silicon single crystal, one of the crystals used as semiconductor device substrates, is primarily manufactured by the Czochralski method (hereinafter abbreviated as "CZ method").

When crystals are manufactured by the CZ method, a crystal manufacturing apparatus as shown in FIG. 4 is, for example, used. The manufacturing apparatus has, for example, members for melting a raw material polycrystal such as silicon and a mechanism for pulling monocrystallized silicon, and these members and the mechanism are accommodated in a main chamber 11. A pulling chamber 12 extending upward is connected from a ceiling portion of the main chamber 11, with a mechanism (not shown) provided on top thereof for pulling a crystal 4 with a wire 10.

Within the main chamber 11, a crucible 5 is arranged for containing a melted raw material melt 6, with the crucible 5 supported by a shaft 9 so as to be free to rotate and move up and down with a drive mechanism (not shown). To compensate for decline in melt level as a result of pulling of the crystal 4, the drive mechanism for the crucible 5 is designed to raise the crucible 5 as much as the melt level declines.

A heater 7 for melting raw material is arranged so as to surround the crucible 5. A heat-insulating material 8 is provided outside the heater 7 so as to encircle the heater 7, thus preventing direct radiation of heat from the heater 7 to the main chamber 11.

A lump of raw material is accommodated in the crucible 5 arranged within such a crystal manufacturing apparatus followed by heating of the crucible 5 with the heater 7, thus melting the lump of raw material in the crucible 5. The crystal 4 of a desired diameter and quality is grown below a seed crystal 2, fastened with a seed holder 1 connected to the wire 10, by allowing the seed crystal 2 to be immersed into the raw material melt 6 resulting from melting of the lump of raw material and then pulling the seed crystal 2. At this time, so-called "necking" is performed in which a neck portion 3 is formed by narrowing the diameter to roughly 3 mm after the seed crystal 2 is immersed into the raw material melt 6, followed by thickening of a crystal until a desired diameter is reached and then pulling of the dislocation free crystal.

The so-called MCZ method (Magnetic field applied Czochralski Method), an improved version of the CZ method, is also known recently. With the MCZ method, a magnetic field is applied to a raw material melt, suppressing thermal convection of the raw material melt and thus manufacturing a crystal. While large diameter silicon single crystals of eight inches or more in diameter are recently in demand, the MCZ method capable of suppressing thermal convection of the raw material melt is effective for manufacturing such large diameter silicon single crystals.

Here, the heater 7 for manufacturing a crystal used in the aforementioned CZ and MCZ methods is cylindrical shape as shown in FIG. 1 and primarily made of isotropic graphite. In the direct current type, currently in vogue, two terminal portions 7b are provided, with the heater 7 supported by the terminal portions 7b. A heat generating portion 7a of the heater 7 has slits 7c provided at several to several tens of locations for efficient heat generation. It is to be noted that the heater 7 generates heat mainly from individual heat-generating slit portions 7d—the portions between the lower end of slits extending from the top and the upper end of slits extending from the bottom.

The crucible must be naturally used larger in size to manufacture large diameter crystals in demand recently at low cost. As a result of upsizing of the crucible, structures around the crucible such as the heater have been upsized. Upsizing of the heater has led to problems to deformation of the heater while in use for crystal manufacture due to heater's own weight and ununiform heat distribution, and further because of interaction between magnetic field and current in the case of magnetic field application as in the MCZ method. Deformation of the heater while in use in crystal manufacture changes the distance between the heater's heat-generating portion and the crystal ingot or the melt, thus changing the heat distribution. This in turn gives rise to ununiform temperature within the raw material melt, resulting in detrimental effects such as hindrance of monocrystallization of the crystal manufactured and unstable quality.

As a countermeasure thereof, dummy terminals are commonly attached to the heater in addition to the two terminal portions, thus supporting the heater by three or more portions (e.g., Japanese Patent Publication No. 7-72116). If the heater is supported by the terminal portions alone, it is supported only at two locations, resulting in easy deformation at those portions with no terminals. This deformation takes place at the upper portion of the heater in such a manner that those portions with terminals expand in diameter while those portions without terminals diminish in diameter. Providing dummy terminals at the portions with no terminals has been effective to a certain extent to prevent such a heater deformation.

However, the heater is divided by slits, making it impossible to completely prevent deformation by provision of terminals and dummy terminals alone. In the case of a larger diameter or taller heater in particular, it is difficult to suppress deformation. In addition to the above, this method led to other problems such as heat loss from the dummy terminal portions and further more complex mechanical construction.

Further, in the MCZ method for manufacturing large diameter crystals while applying a current magnetic field, deformation is caused not only by heater's own weight and thermal expansion but also electromagnetic force resulting from interaction between heater current and magnetic field. This electromagnetic force is considerably strong, making it difficult to avoid heater deformation even if the heater is supported by the entire lower end.

Accordingly, a method is proposed in the MCZ method that prevents deformation by using a doubled-structured heater consisting of slitted inner and outer heaters and apply direct currents in different directions in respectively, thus suppressing electromagnetic force resulting from interaction between heater current and magnetic field (e.g., Japanese Patent Application Laid-Open Publication No. 9-208371).

The aforementioned method, although being effective to a certain extent for preventing deformation due to electromagnetic force, results in problems such as considerably increased cost due to more complex mechanical construction and larger deformation, conversely, due to heater's own weight.

Meanwhile, an attempt is being tried out to change the heater material from isotropic graphite to a stronger and lighter material such as carbon composite. However, this method leads to problems such as unstable heat generation, higher heater material cost and further lower purity of crystal manufactured.

DISCLOSURE OF THE INVENTION

In light of the above problems, it is an object of the present invention to provide a heater for manufacturing a crystal, a crystal manufacturing apparatus and a crystal manufacturing method using the heater capable of inexpensively, easily and reliably preventing hindrance of monocrystallization and unstable crystal quality caused by ununiform temperature in the raw material melt due to deformation of the shape of the heater's heat generating portion while in use for crystal manufacture even in the case of manufacture of large diameter crystals of eight inches or more in diameter.

The present invention was conceived to solve the above problems. According to the present invention, there is provided a heater for manufacturing a crystal by the Czochralski method comprising at least terminal portions supplied with current and a heat generating portion by resistance heating, and being arranged so as to surround a crucible containing a raw material melt, wherein the heater has a uniform heat generation distribution to the raw material melt after the heater shape undergoes deformation while in use during crystal manufacture.

Thus, the heater has a uniform heat generation distribution to the raw material melt after the heater shape undergoes deformation while in use during crystal manufacture, making it possible to reduce temperature gradient in the raw material melt following deformation. This suppresses the crystal from becoming dislocated during pulling, allowing obtaining crystals of high quality in an inexpensive, easy and reliable manner.

It is to be noted that the term "uniform heat generation distribution to the raw material melt" indicates that heat from the heater is radiated concentrically toward the raw material melt.

According to the present invention, there is provided a heater for manufacturing a crystal by the Czochralski method comprising at least terminal portions supplied with current and a heat generating portion by resistance heating, and being arranged so as to surround a crucible containing a raw material melt, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

Thus, the heater's heat generating portion is elliptical in horizontal cross section but becomes circular in horizontal cross section as a result of heater deformation while in use during crystal manufacture, making it possible to provide a uniform heat generation distribution to the raw material melt after deformation. This suppresses the crystal from becoming dislocated during pulling, allowing obtaining crystals of high quality in an inexpensive, easy and reliable manner.

In this case, the elliptical shape of the horizontal cross section of the heat generating portion is preferably achieved by reducing the diameter in advance in the direction in which the diameter grows larger as a result of heater shape deformation while in use during crystal manufacture and by expanding the diameter in advance in the direction in which the diameter grows smaller. When, in the elliptical shape of the horizontal cross section of the heat generating portion, the longer diameter is D1 and the shorter diameter is D2, the value of D1/D2 is preferably 1.01 to 1.20.

Thus, the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller, making it possible to reliably provide uniform heat generation to the raw material melt after deformation. It is preferred in terms of heater machinability, cost and strength that the ratio of the longer diameter to the shorter diameter of the elliptical shape be 1.01 to 1.20.

The present invention further provides a heater for manufacturing a crystal by the Czochralski method comprising at least terminal portions supplied with current and a heat generating portion by resistance heating, and being arranged so as to surround a crucible containing a raw material melt, wherein the heat generating portion of the heater has an uneven distribution of electrical resistance.

Thus, the heater's heat generating portion has an uneven distribution of electrical resistance, making it possible to provide uniform heat generation to the raw material melt after deformation. This suppresses the crystal from becoming dislocated during pulling, allowing obtaining crystals of high quality in an inexpensive, easy and reliable manner.

In this case, the uneven distribution of electrical resistance of the heat generating portion is preferably such that electrical resistance is increased in advance in the direction in which the diameter grows larger as a result of heater shape deformation while in use during crystal manufacture, whereas electrical resistance is reduced in advance in the direction in which the diameter grows smaller.

Thus, the uneven distribution of electrical resistance of the heat generating portion is such that electrical resistance is increased in advance in the direction in which the diameter grows larger as a result of heater shape deformation while in use during crystal manufacture, whereas electrical resistance is reduced in advance in the direction in which the diameter grows smaller, making it possible to provide a uniform heat generation distribution to the raw material melt after deformation.

In this case, the uneven distribution of electrical resistance of the heat generating portion is preferably adjusted by changing one or more of thickness, width, and length of heat generating slit portions.

Thus, the uneven distribution of electrical resistance of the heat generating portion can be readily adjusted by changing one or more of the heat generating slit portions' thickness, width and length.

The uneven distribution of electrical resistance of the heat generating portion is preferably such that when electrical resistance is R1 in the direction in which the diameter grows larger as a result of heater shape deformation while in use during crystal manufacture and electrical resistance is R2 in the direction in which the diameter grows smaller, the value of R1/R2 is 1.01 to 1.10.

Thus, the uneven distribution of electrical resistance of the heat generating portion is such that when electrical resistance is R1 in the direction in which the diameter grows larger as a result of heater shape deformation while in use during crystal manufacture and electrical resistance is R2 in the direction in which the diameter grows smaller, the value of R1/R2 is 1.01 to 1.10, making it possible to reliably provide uniform heat generation to the raw material melt after deformation without bringing about serious problems in terms of heater machining, strength and others.

In the heater for manufacturing a crystal of the present invention, the shape of the horizontal cross section of the heat generating portion of the heater may be an elliptical shape, and the shape of the horizontal cross section of the heat generating portion may become a circular shape as a result of heater shape deformation while in use during crystal manufacture. In addition, the heat generating portion of the heater may have the uneven distribution of electrical resistance.

Thus, in addition to the fact that the heater's heat generating portion is elliptical in horizontal cross section but becomes circular in horizontal cross section as a result of heater shape deformation while in use during crystal manufacture, the heat generating portion has the uneven distribution of electrical resistance, making it possible to minutely and finely adjust heat generation to the raw material melt after deformation and thereby reliably providing a uniform heat generation distribution.

Further, the Czochralski method in which the heater is used may be the MCZ method.

Thus, the heater for manufacturing a crystal according to the present invention is particularly effective for manufacturing a crystal by the MCZ method. The reason for this lies in that the MCZ method is particularly employed for manufacturing large diameter crystals and that the heater more readily deforms as a result of interaction between current and magnetic field.

Further, the crystal to be manufactured can be silicon single crystals.

In this manner, the heater for manufacturing a crystal according to the present invention can be used as a heater for manufacturing silicon single crystals that have seen significant growth in diameter and upsizing of the heater as a result thereof particularly recently.

Further, the present invention provides a crystal manufacturing apparatus comprising the aforementioned heater for manufacturing a crystal and a crystal manufacturing method for manufacturing a crystal by the Czochralski method using the crystal manufacturing apparatus.

It is possible to obtain crystals of high quality in an inexpensive, easy and reliable manner by manufacturing a crystal by the Czochralski method using the crystal manufacturing apparatus furnished with the heater for manufacturing a crystal according to the present invention.

As described above, the heater used for manufacturing a crystal by the CZ method has a uniform heat generation distribution to the raw material melt, according to the present invention, after the shape of the heat generating portion undergoes a deformation while in use during crystal manufacture, providing improved dislocation free rate of crystals in single crystal manufacture and thereby reliably ensuring stable manufacture of high-quality crystals in an inexpensive, easy and reliable manner.

BEST MODE FOR CARRYING OUT THE INVENTION

While examples of the present invention will be described below, the present invention is not limited thereto.

In today's large diameter crystal manufacturing using large-sized heater, in particular, it is difficult to completely prevent heater shape deformation while in use during crystal manufacture. While the heater may be divided to prevent such a heater shape deformation, the division would likely lead to problems such as more complex inner construction of the furnace and higher cost of structures in the furnace. Further, it is even more difficult to prevent heater shape deformation in the case of the MCZ method in which a magnetic field is applied. This has, as a result, made it difficult to prevent ununiform temperature in the raw material melt. For this reason, the present inventors though out the fact that ununiform temperature in the raw material melt can be prevented by admitting that the heater will deform rather than preventing it and designing the heater with heater shape deformation in mind in advance such that after deformation the heater has a uniform heat generation distribution to the raw material melt, thus perfecting the present invention.

That is, the following two measures are proposed in the present invention to ensure that the heater has a uniform heat generation distribution to the raw material melt in the event of a heater shape deformation while in use during crystal manufacture.

The first measure consists of having an elliptical, rather than circular, horizontal cross-section shape of the heat generating portion in expectation of heater shape deformation while in use during crystal manufacture.

Figure 3:
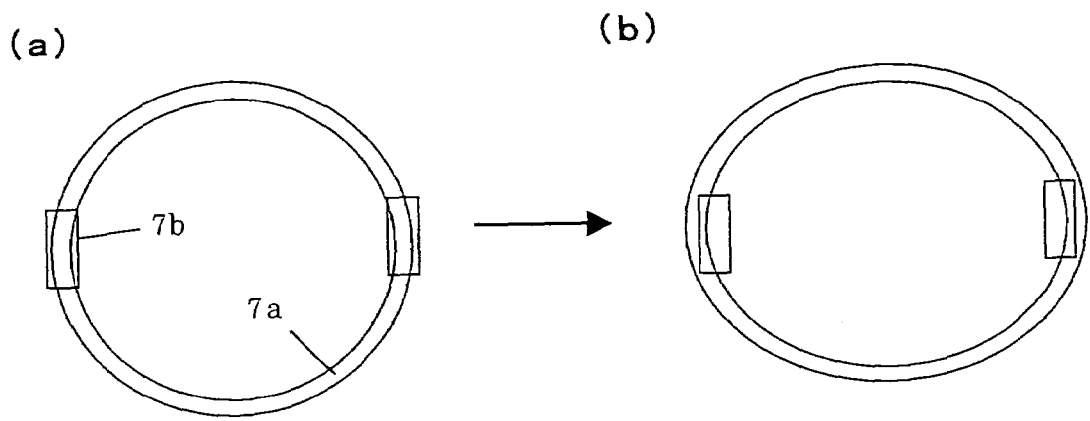
FIGS. 3(a) and 3(b) are schematic views respectively showing the horizontal cross-sectional shape of a heat generating portion of a conventional circular heater for manufacturing a crystal before and after deformation.
Figure 4:
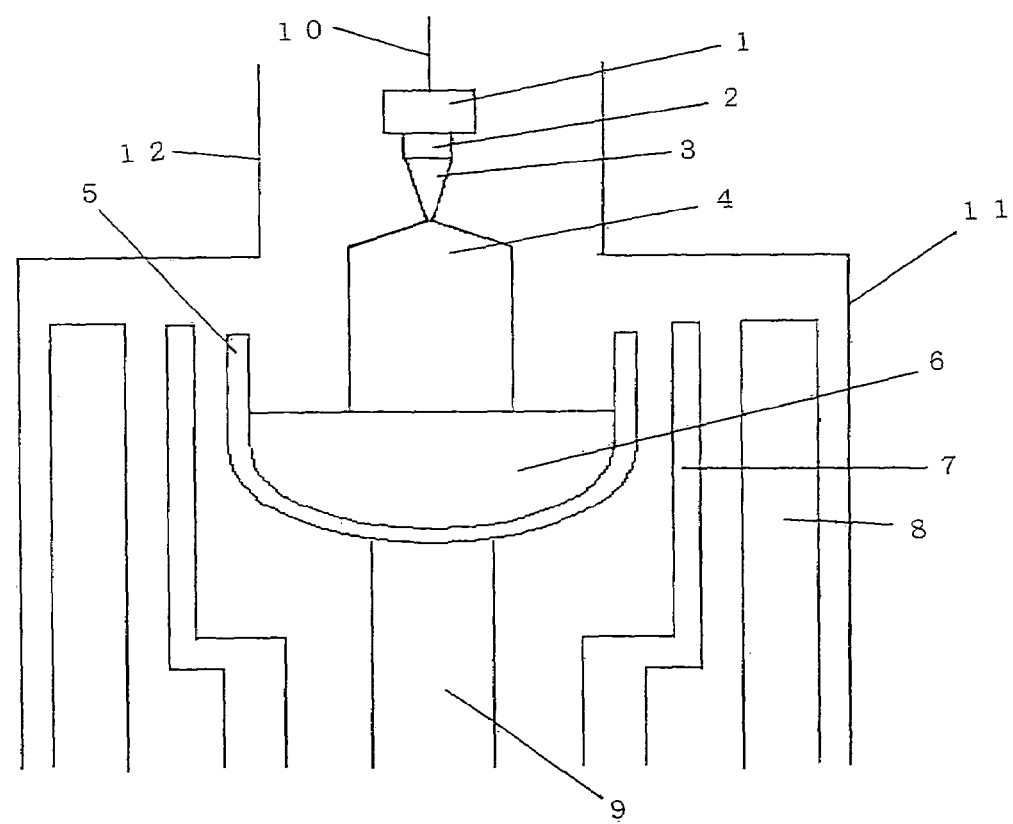
FIG. 4 is a schematic view showing a crystal manufacturing apparatus by the CZ method.

Here, FIGS. 3(a) and 3(b) are schematic views respectively showing the horizontal cross-sectional shape of the heat generating portion of a conventional heater for manufacturing a crystal before and after deformation. As shown in FIG. 3, the conventional circular heat generating portion, initially circular, undergoes a deformation while in use, expanding in diameter after deformation in the direction in which the terminal portions 7b are connected together, diminishing in diameter, conversely, after deformation in the direction in which portions 90° apart from the terminal portions 7b are connected together and becoming elliptical in shape.

Figure 2:
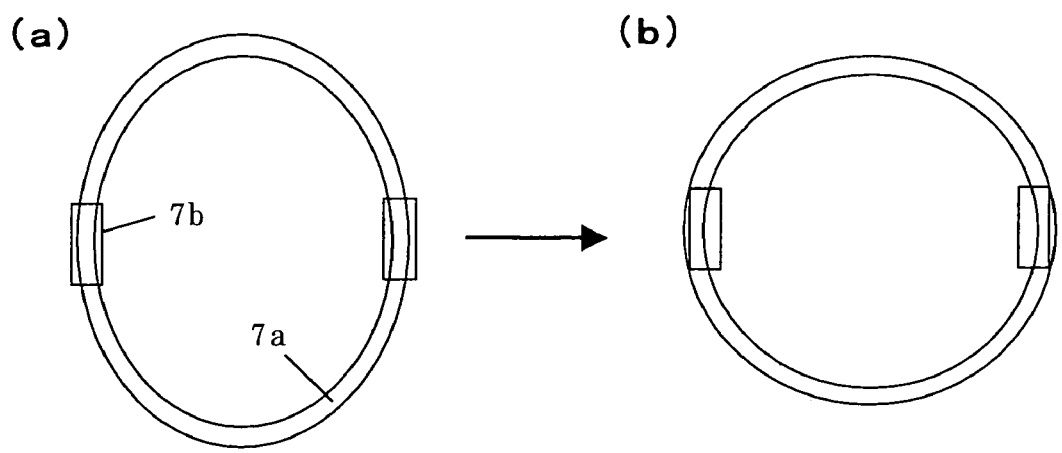
FIGS. 2(a) and 2(b) are schematic views respectively showing the horizontal cross-sectional shape of a heat generating portion of the elliptical heater for manufacturing a crystal according to the present invention before and after deformation.

In the present invention, for this reason, the heat generating portion is diminished in diameter in advance in the direction in which the diameter grows larger as a result of heater shape deformation, whereas the heat generating portion is expanded in diameter in advance in the direction in which the diameter grows smaller as a result of the deformation as shown in FIGS. 2(a) and 2(b), thus making available the elliptical heat generating portion (FIG. 2(a)). This allows the horizontal cross-sectional shape of the heat generating portion of the heater to become circular (FIG.

2(b)) during deformation due to its own weight and so on while in use, thus providing uniform heat generation to the raw material melt following deformation.

On the other hand, when the horizontal cross-sectional shape of the heat generating portion of the heater is elliptical as in this case, the upper and lower portions of the heater's heat generating portion trade places—one with diminishing diameter and the other with expanding diameter. Therefore, it is most preferred that the upper and lower portions be different in diameter. However, such a heater results in a complex shape of the heat generating portion, thus making its fabrication difficult. In actuality, therefore, it is most effective to determine the shape primarily taking into consideration deformation of the heat generating slit portions.

It is to be noted that when the horizontal cross-sectional shape of the heat generating portion of the heater is elliptical as described above, it is preferred that, when the longer diameter is D1 and the shorter diameter is D2, the value of D1/D2 be 1.01 to 1.20. Further, it is more preferred that the value of D1/D2 be 1.03 to 1.10.

Unless the value of D1/D2 is 1.01 or more, it is nearly impossible to expect an effect of canceling out the heater's deformed portion. On the other hand, an elliptical shape with the value beyond 1.20 results in high machining cost. Also in terms of heater strength, it is preferred that the value be 1.20 or less.

The second measure consists of imparting an uneven distribution to the electrical resistance of the heat generating portion in advance in anticipation of heater shape deformation while in use during crystal manufacture. At this time, electrical resistance of the heat generating portion is increased in advance in the direction in which the diameter grows larger as a result of heater shape deformation, whereas electrical resistance is reduced in advance in the direction in which the diameter grows smaller as a result of the deformation. This ensures that areas farther from the raw material melt generate more heat whereas areas closer to the raw material melt generate less heat during deformation, thus providing uniform heat generation to the raw material melt after deformation.

Figure 1:
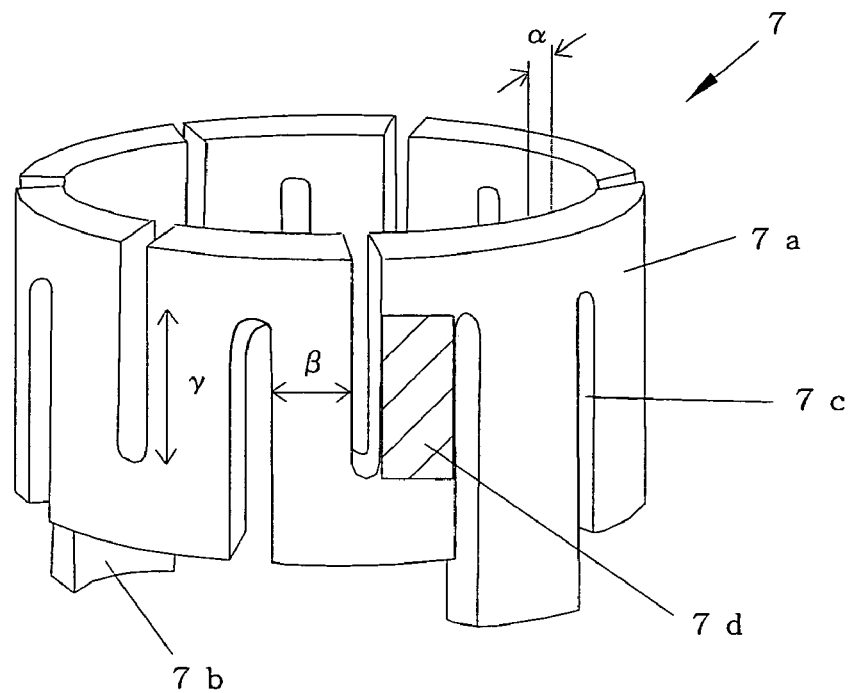
FIG. 1 is a schematic perspective view showing a heater for manufacturing a crystal.

Electrical resistance distribution of the heat generating portion can be adjusted, for example, by changing one or more of (1) the thickness of the heat generating slit portion (symbol "α" in FIG. 1), (2) the width of the heat generating slit portion (symbol "β" in FIG. 1) and (3) the length of the heat generating slit portion (symbol "γ" in FIG. 1).

It is to be noted that if an uneven distribution is imparted to the electrical resistance of the heat generating portion as described above, it is preferred that when electrical resistance is R1 in the direction in which the diameter grows larger as a result of heater shape deformation while in use during crystal manufacture and electrical resistance is R2 in the direction in which the diameter grows smaller, the value of R1/R2 be distributed in the range from 1.01 to 1.10. Further, it is more preferred that the value of R2/R1 be distributed in the range from 1.01 to 1.05.

The reason lies in that the value of R2/R1 below 1.01 will prove limitedly effective whereas changes in thickness and others so as to have the value beyond 1.10 will involve difficulty in machining and may present a problem in terms of heater strength.

On the other hand, a heater may be employed that combines the aforementioned both measures. This allows for fine adjustment to provide uniform heat generation to the raw material melt. That is, the horizontal cross-sectional shape of the heater's heat generating portion is made elliptical at the same time imparting an uneven distribution to the electrical resistance. This makes it possible to deal with any deformation in the heater, allowing for fine adjustment to uniform temperature distribution. Moreover, this makes it possible to reduce the magnitude of shape deformation of the heater to be machined, as a result of which favorable results were obtained in terms of heater strength.

As described above, the heater for manufacturing a crystal according to the present invention is particularly effective for manufacturing a crystal by the MCZ method. The heater for manufacturing a crystal according to the present invention can also be employed to manufacture silicon single crystals.

The heater according to the present invention is used in the MCZ method because the MCZ method is particularly employed for manufacturing large diameter crystals and also because the heater readily deforms as a result of interaction between current and magnetic field. The heater according to the present invention is used to manufacture silicon single crystals because the heater size is on the increase due to recent significant growth particularly in silicon single crystal diameter.

Further, the present invention provides a crystal manufacturing apparatus furnished with the aforementioned heater for manufacturing a crystal and a crystal manufacturing method for manufacturing a crystal by the Czochralski method using the crystal manufacturing apparatus. The present invention can significantly improve monocrystallization rate by simply placing the heater having the above properties in a crystal manufacturing apparatus having a conventional furnace structure, eliminating the need to make design and other changes to the existing apparatus and thereby providing an extremely easy and inexpensive way to configure a crystal manufacturing apparatus.

The heater for manufacturing a crystal provided by the present invention has a uniform heat generation distribution to the raw material melt after deformation while in use during crystal manufacture, thus providing improved dislocation free rate of crystals in single crystal manufacture and thereby ensuring stable manufacture of high-quality crystals. Moreover, the heater keeps the furnace inner structure non-complex and allows ensuring uniformity in heat generation distribution to the raw material melt in a relatively inexpensive and reliable manner.

While described more specifically below with reference to examples, the present invention is not limited thereto.

EXAMPLE 1

Silicon single crystals were manufactured by the MCZ method in which a horizontal magnetic field was applied. Raw material—300 kg of silicon—was charged into a 32-inch-diameter crucible (800 mm), with 12-inch-diameter silicon single crystals (305 mm) pulled. At this time, a heater was used having an elliptical heat generating portion—with the longer diameter D1 of 925 mm and the shorter diameter D2 (terminal side) of 915 mm (D1/D2=1.01)—and a uniform electrical resistance across the heat generating portion. Crystal manufacture using this heater proceeded with no particular problems, successfully growing crystals to the end.

It is to be noted that dislocation free rate is shown in Table 1 when silicon single crystals were pulled 20 times under these conditions.

EXAMPLE 2

As with example 1, silicon single crystals were manufactured by the MCZ method in which a horizontal magnetic field was applied. Raw material—300 kg of silicon—was charged into a 32-inch-diameter crucible (800 mm), with 12-inch-diameter silicon single crystals (305 mm) pulled. At this time, a heater was used having a circular heat generating portion of 920 mm in diameter, in which when electrical resistance of the heat generating slit portions is R1 in the direction (terminal side) in which the diameter grows larger to become the longer diameter as a result of heater shape deformation while in use during crystal manufacture and electrical resistance of the heat generating slit portions is R2 in the direction in which the diameter grows smaller to become the shorter diameter, R1/R2=1.10. An uneven distribution was imparted to the electrical resistance of the heat generating slit portions by making the heat generating slit portions constituting the shorter diameter 33 mm in thickness and those portions constituting the longer diameter 30 mm in thickness. Crystal manufacture using this heater proceeded with no particular problems, successfully growing crystals to the end.

It is to be noted that dislocation free rate is shown in Table 1 when silicon single crystals were pulled 20 times under these conditions.

Comparative Example 1

As with example 1, silicon single crystals were manufactured by the MCZ method in which a horizontal magnetic field was applied. Raw material—300 kg of silicon—was charged into a 32-inch-diameter crucible (800 mm), with 12-inch-diameter silicon single crystals (305 mm) pulled. At this time, a heater was used having a circular heat generating portion of 920 mm in diameter (D1/D2=1.00), in which the electrical resistance was uniform across the heat generating portion (R1/R2=1.00). It was confirmed, however, at the time of attachment inside the crystal manufacturing apparatus at room temperature that the heater had deformed by its own weight to an elliptical shape with the longer diameter of 930 mm and the shorter diameter of 910 mm. Crystal manufacture using this heater led, after manufacturing a certain number of crystals, to surface solidification of the raw material melt being spotted in the direction in which the heat generating portion constituted the longer diameter, occasionally leaving no alternative but to stop crystal manufacture.

It is to be noted that dislocation free rate is shown in Table 1 when silicon single crystals were pulled 20 times under these conditions.

TABLE 1

|  | Example 1 | Example 2 | Comparative example 1 |
|---|---|---|---|
| Dislocation-free rate (%) | 85 | 85 | 50 |

As is apparent from Table 1, dislocation-free rate of grown crystals is higher when crystals were grown using the heater from examples 1 and 2 than when crystals were grown using the heater from comparative example 1, demonstrating that dislocation-free rate has been significantly improved.

It is to be noted that the present invention is not limited to the aforementioned embodiments. The above embodiments are illustrative, and all those having a configuration substantially identical to and producing a similar effect to the technical concept described in the claims of the present invention are included in the technical scope of the present invention.

For example, while the MCZ method was described in the examples of the present invention in which a magnetic field is applied primarily during pulling of a silicon single crystal, the present invention is not limited thereto and may be used for the normal CZ method in which no magnetic field is applied.

Moreover, crystals to be pulled are not limited to silicon, and it is needless to say that the present invention can be used for growing compound semiconductors, oxide single crystals and others.

The invention claimed is:

1. A heater for manufacturing a crystal by the Czochralski method comprising at least terminal portions supplied with current and a heat generating portion by resistance heating, and being arranged so as to surround a crucible containing a raw material melt, wherein the heater has a uniform heat generation distribution to the raw material melt after a shape of a horizontal cross section of the heater undergoes deformation while in use during crystal manufacture.

2. A heater for manufacturing a crystal by the Czochralski method comprising at least terminal portions supplied with current and a heat generating portion by resistance heating, and being arranged so as to surround a crucible containing a raw material melt, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

3. The heater for manufacturing a crystal according to claim 2, wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller.

4. The heater for manufacturing a crystal according to claim 3, wherein when, in the elliptical shape of the horizontal cross section of the heat generating portion, the longer diameter is D1 and the shorter diameter is D2, the value of D1/D2 is 1.01 to 1.20.

5. The heater for manufacturing a crystal according to claim 2, wherein when, in the elliptical shape of the horizontal cross section of the heat generating portion, the longer diameter is D1 and the shorter diameter is D2, the value of D1/D2 is 1.01 to 1.20.

6. A heater for manufacturing a crystal by the Czochralski method comprising at least terminal portions supplied with current and a heat generating portion by resistance heating, and being arranged so as to surround a crucible containing a raw material melt, wherein the heat generating portion of the heater has an uneven distribution of electrical resistance, and wherein the uneven distribution of electrical resistance of the heat generating portion is such that electrical resistance is increased in advance in the direction in which a diameter of the heater grows larger as a result of heater shape deformation while in use during crystal manufacture, whereas electrical resistance is reduced in advance in the direction in which the diameter grows smaller.

7. The heater for manufacturing a crystal according to claim 6, wherein the uneven distribution of electrical resistance of the heat generating portion is adjusted by changing one or more of thickness, width, and length of heat generating slit portions.

8. The heater for manufacturing a crystal according to claim 7, wherein the uneven distribution of electrical resistance of the heat generating portion is such that when electrical resistance is R1 in the direction in which the diameter grows larger as a result of heater shape deformation while in use during crystal manufacture and electrical resistance is R2 in the direction in which the diameter grows smaller, the value of R1/R2 is 1.01 to 1.10.

9. The heater for manufacturing a crystal according to claim 8, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

10. The heater for manufacturing a crystal according to claim 6, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller.

11. The heater for manufacturing a crystal according to claim 8, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein when, in the elliptical shape of the horizontal cross section of the heat generating portion, the longer diameter is D1 and the shorter diameter is D2, the value of D1/D2 is 1.01 to 1.20.

12. The heater for manufacturing a crystal according to claim 8, wherein a shape of a horizontal cross section of the heat generating portion of the heater is an elliptical shape, and the shape of the horizontal cross section of the heat generating portion becomes a circular shape as a result of heater shape deformation while in use during crystal manufacture, wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller, and wherein when, in the elliptical shape of the horizontal cross section of the heat generating portion, the longer diameter is D1 and the shorter diameter is D2, the value of D1/D2 is 1.01 to 1.20.

13. The heater for manufacturing a crystal according to claim 7, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller.

14. The heater for manufacturing a crystal according to claim 7, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein when, in the elliptical shape of the horizontal cross section of the heat generating portion, the longer diameter is D1 and the shorter diameter is D2, the value of D1/D2 is 1.01 to 1.20.

15. The heater for manufacturing a crystal according to claim 7, wherein a shape of a horizontal cross section of the heat generating portion of the heater is an elliptical shape, and the shape of the horizontal cross section of the heat generating portion becomes a circular shape as a result of heater shape deformation while in use during crystal manufacture, wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller, and wherein when, in the elliptical shape of the horizontal cross section of the heat generating portion, the longer diameter is D1 and the shorter diameter is D2, the value of D1/D2 is 1.01 to 1.20.

16. The heater for manufacturing a crystal according to claim 6, wherein the uneven distribution of electrical resistance of the heat generating portion is such that when electrical resistance is R1 in the direction in which the diameter grows larger as a result of heater shape deformation while in use during crystal manufacture and electrical resistance is R2 in the direction in which the diameter grows smaller, the value of R1/R2 is 1.01 to 1.10.

17. The heater for manufacturing a crystal according to claim 16, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

18. The heater for manufacturing a crystal according to claim 16, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller.

19. The heater for manufacturing a crystal according to claim 16, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein when, in the elliptical shape of the horizontal cross section of the heat generating portion, the longer diameter is D1 and the shorter diameter is D2, the value of D1/D2 is 1.01 to 1.20.

20. The heater for manufacturing a crystal according to claim 16, wherein a shape of a horizontal cross section of the heat generating portion of the heater is an elliptical shape, and the shape of the horizontal cross section of the heat generating portion becomes a circular shape as a result of heater shape deformation while in use during crystal manufacture, wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller, and wherein when, in the elliptical shape of the horizontal cross section of the heat generating portion, the longer diameter is D1 and the shorter diameter is D2, the value of D1/D2 is 1.01 to 1.20.

21. The heater for manufacturing a crystal according to claim 6, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

22. The heater for manufacturing a crystal according to claim 7, wherein a shape of a horizontal cross section of the heat generating portion of the heater is an elliptical shape, and the shape of the horizontal cross section of the heat generating portion becomes a circular shape as a result of heater shape deformation while in use during crystal manufacture.

23. The heater for manufacturing a crystal according to claim 6, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller.

24. The heater for manufacturing a crystal according to claim 6, wherein a shape of a horizontal cross section of the heat generating portion of the heater is an elliptical shape, and the shape of the horizontal cross section of the heat generating portion becomes a circular shape as a result of heater shape deformation while in use during crystal manufacture and wherein when, in the elliptical shape of the horizontal cross section of the heat generating portion, the longer diameter is D1 and the shorter diameter is D2, the value of D1/D2 is 1.01 to 1.20.

25. The heater for manufacturing a crystal according to claim 6, wherein a shape of a horizontal cross section of the heat generating portion of the heater is an elliptical shape, and the shape of the horizontal cross section of the heat generating portion becomes a circular shape as a result of heater shape deformation while in use during crystal manufacture, wherein the elliptical shape of the horizontal cross section of the heat generating portion is achieved by reducing the diameter in advance in the direction in which the diameter grows larger as a result of heater shape deformation while in use during crystal manufacture and by expanding the diameter in advance in the direction in which the diameter grows smaller, and wherein when, in the elliptical shape of the horizontal cross section of the heat generating portion, the longer diameter is D1 and the shorter diameter is D2, the value of D1/D2 is 1.01 to 1.20.

* * * * *